United States Patent
Horch et al.

(10) Patent No.: US 6,980,457 B1
(45) Date of Patent: *Dec. 27, 2005

(54) THYRISTOR-BASED DEVICE HAVING A REDUCED-RESISTANCE CONTACT TO A BURIED EMITTER REGION

(75) Inventors: Andrew Horch, Sunnyvale, CA (US); Scott Robins, San Jose, CA (US)

(73) Assignee: T-RAM, Inc., San Jose, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 10/288,927

(22) Filed: Nov. 6, 2002

(51) Int. Cl.[7] .............................................. G11C 17/06
(52) U.S. Cl. ........................ 365/105; 257/133; 257/137; 257/156
(58) Field of Search .............................. 365/105, 174, 365/175; 257/107, 133, 137, 156

(56) References Cited

U.S. PATENT DOCUMENTS

| | | | |
|---|---|---|---|
| 6,104,045 A | | 8/2000 | Forbes et al. |
| 6,225,165 B1 | | 5/2001 | Noble, Jr. et al. |
| 6,229,161 B1 | | 5/2001 | Nemati et al. |
| 6,583,452 B1 | * | 6/2003 | Cho et al. ................... 257/107 |
| 6,666,481 B1 | * | 12/2003 | Horch et al. ................ 257/133 |
| 6,703,646 B1 | * | 3/2004 | Nemati et al. .............. 257/107 |
| 6,735,113 B2 | * | 5/2004 | Yoon et al. .................. 365/174 |
| 6,756,612 B1 | * | 6/2004 | Nemati et al. .............. 257/156 |

OTHER PUBLICATIONS

Jörn Lützen, Albert Birner, Matthias Goldbach, Martin Gutsche, Thomas Hecht, Stefan Jakschik, Andreas Orth, Annette Sänger, Uwe Schröder, Harald Seidl, Bernhard Sell and Dirk Schumann, *Integration of Capacitor for Sub–100–nm DRAM Trench Technology*, 2002 Symposium on VLSI Technology Digest of Technical Papers, 2000, month unavailable.

K. DeMeyers, S. Kubicek and H. van Meer, *Raised Source/Drains with Disposable Spacers for sub 100 nm CMOS technologies*, Extended Abstracts of International Workshop on Junction Technology 2001, month unavailable.

Mark Rodder and D. Yeakley, *Raised Source/Drain MOSFET with Dual Sidewall Spacers*, IEEE Electron Device Letters, vol. 12, No. 3, Mar. 1991.

Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

(Continued)

*Primary Examiner*—Richard Elms
*Assistant Examiner*—Toan Le

(57) ABSTRACT

A thyristor-based semiconductor device is formed having a thyristor, a pass device and an emitter region buried in a substrate and below at least one other vertically-arranged contiguous region of the thyristor that is at least partially below an upper surface of the substrate. According to an example embodiment of the present invention, a conductor, such as a polysilicon pillar formed in a trench, extends through the substrate and to the buried emitter region of the thyristor. In one implementation, a portion of the conductor includes a reduced-resistance material, such as a salicide, that is adapted to reduce the resistance of an electrical connection made to the buried emitter region via the conductor. This is particularly useful, for example, in connecting the buried emitter region to a power supply at a reduced resistance (e.g., as compared to the resistance that would be exhibited, were the reduced-resistance material not present).

28 Claims, 5 Drawing Sheets

OTHER PUBLICATIONS

N. Lindert, Y.-K, Choi, L. Chang, E. Anderson, W.-C. Lee, T.-J. King, J. Bokor, and C. Hu, *Quasi–Planar FinFETs with Selectively Grown Germanium Raised Source/Drain*, 2001 IEEE International SOI Conference, Oct. 1, 2001.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide*, 1998 Symposium on VLSI Technology Digest of Technical Papers, 1998, month unavailable.

Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}G8_x$ Raised Source and Drain*, IEEE Transactions on Electron Devices, vol. 48, No. 8, Aug. 2001.

Stanley Wolf Ph.D. and Richard N. Tauber P.D., *Silicon Processing for The VLSI Era*, vol. 1, 1986, pp. 285–286, 1986, month unavaiable.

* cited by examiner

THYRISTOR-BASED DEVICE HAVING A REDUCED-RESISTANCE CONTACT TO A BURIED EMITTER REGION

RELATED PATENT DOCUMENTS

This patent document is related to U.S. patent application Ser. No. 10/262,729, filed on Oct. 1, 2002 and entitled "Trench Isolation for Thyristor-based Device," to U.S. patent application Ser. No. 10/262,728, filed on Oct. 1, 2002, now U.S. Pat. No. 6,666,481 and entitled "Shunt Connection to Buried Emitter for Thyristor-based Semiconductor Device" and to U.S. patent application Ser. No. 10/262,696, filed on Oct. 1, 2002 and entitled "Buried Emitter Contact for Thyristor-based Semiconductor Device," all of which are fully incorporated herein by reference.

FIELD OF THE INVENTION

The present invention is directed to semiconductor devices and, more specifically, to thyristor-based devices including thyristor-based memory devices.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the circuit design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price). DRAM cell size is typically between 6 $F^2$ and 8 $F^2$ where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing. Thin capacitively-coupled thyristor-type NDR devices can be used to overcome these limitations in memory applications as well as other applications. However, another important consideration in semiconductor device design, including the design of memory cells employing thin capacitively-coupled thyristors, is forming devices in highly-dense arrays to meet demands for ever-increasing memory volume and speed.

These and other design considerations have presented challenges to the implementation of such a thin capacitively-coupled thyristor to bulk substrate applications, and in particular to applications where highly-dense arrays of thyristors are desirable.

SUMMARY

The present invention is directed to overcoming the above-mentioned challenges and others related to thyristor-based devices and applications, including those that are discussed above. The present invention is exemplified in a number of implementations and applications, some of which are summarized below.

According to an example embodiment of the present invention, a thyristor-based semiconductor device includes a conductive contact to an emitter region of a thyristor, with the emitter region being buried in a substrate and the conductive contact being arranged to facilitate a low resistance contact to the buried emitter region. The thyristor includes a body having the emitter region and a control port adapted for capacitively coupling to the body for controlling current in the thyristor. The contact extends from the buried emitter region at least to an upper surface of the substrate, making possible electrical connection to the emitter region from the upper surface (e.g., for contacting the buried emitter to a power supply).

According to a more particular example embodiment of the present invention, the thyristor-based semiconductor device discussed above further includes a pass device coupled in series with an emitter region of the thyristor. The pass device is adjacent to the thyristor and includes source/drain regions separated by a channel region in the substrate and a gate adapted to be capacitively coupled to the channel region and to control current flow in the pass device. A first one of the source/drain regions is electrically coupled to the emitter region of the thyristor, and with the gate controlling current flow therein, the pass device effectively controls electrical access between a second one of the source/drain regions and the emitter region of the thyristor to which the first source/drain region is coupled.

In another example embodiment of the present invention, the thyristor-based semiconductor device having a pass device, discussed above, is configured and arranged as a memory cell adapted for read and write access. The emitter region electrically coupled to the first source/drain region of the thyristor is adapted for storing data (e.g., a logical "one" or "zero"). The memory cell is arranged such that the storage and retrieval of the data can be controlled via signals applied to the thyristor control port, to the gate of the pass device and to the conductive contact.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1A:
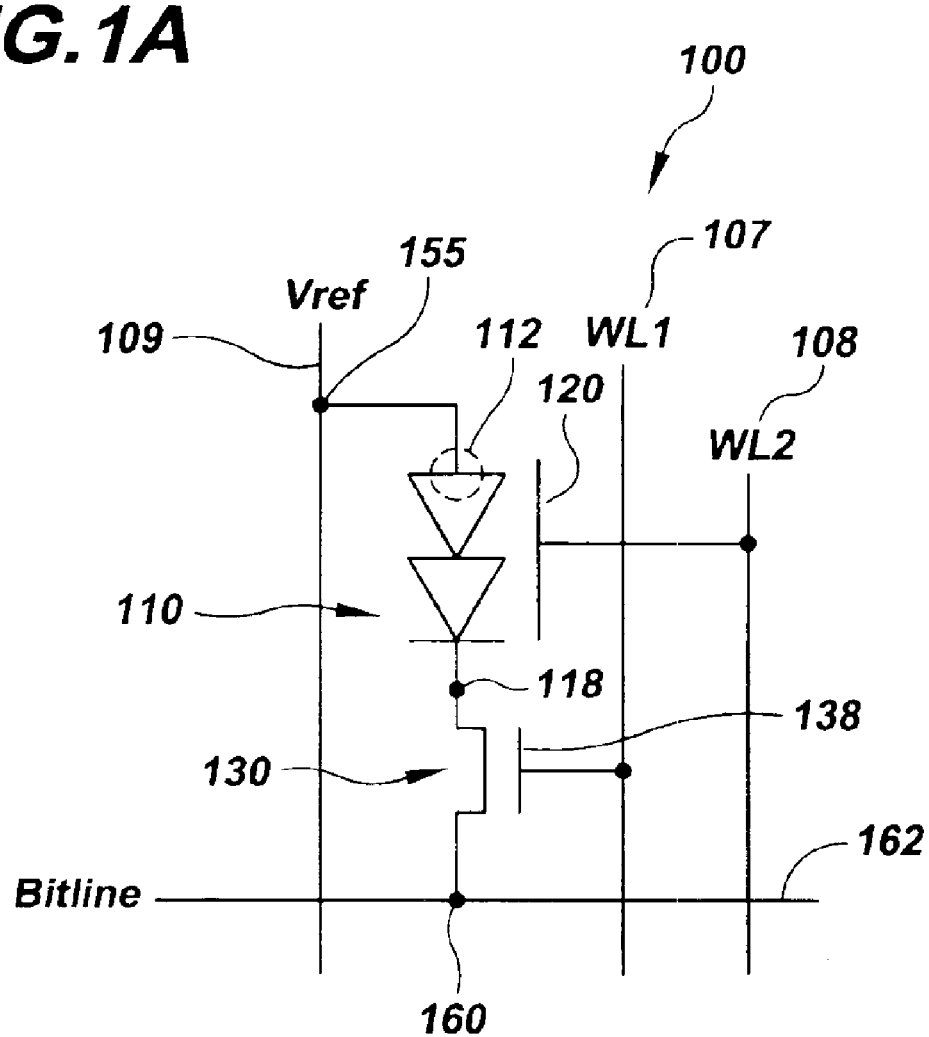
FIG. 1A is a schematic of a thyristor-based semiconductor device having a conductive contact to a buried emitter region, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications, such as memory and current-switching applications, having a buried emitter region to which electrical contact is desired to be made. While the present invention is not necessarily limited to such applications, various aspects of the invention may be appreciated through a discussion of various examples using these contexts.

According to an example embodiment of the present invention, a thyristor-based semiconductor device includes a thyristor having a buried emitter region in a substrate and a conductor electrically coupled to the buried emitter region and extending to an upper surface of the substrate. With this approach, electrical contact to the buried emitter region is readily made via a portion of the conductor near the upper surface of the substrate (e.g., the buried emitter region is not necessarily readily accessible because it is buried in the substrate).

The conductor is formed in a variety of manners using one or more of a variety of materials, depending upon the application. In one implementation, the conductor includes polysilicon deposited in a trench extending from the buried emitter region to an upper portion of the substrate. The polysilicon is doped to a particular polarity (e.g., to the same polarity as the buried emitter region to which it makes contact). In another implementation, the conductor includes a combination of doped polysilicon and conductive materials such as metal. In still another implementation, the conductor includes a metal-lined trench filled with doped polysilicon. For general information regarding these and other thyristor-based implementations, and for specific information regarding other conductive contact approaches that may be implemented in connection with one or more example embodiments of the present invention, reference may be made to the above-referenced U.S. patent application entitled "Shunt Connection to Buried Emitter for Thyristor-based Semiconductor Device" (Horch, et al.).

In various implementations involving conductors such as those discussed above, salicide is used for making contact to the buried emitter regions. In one instance, the salicide is formed at an upper portion of the conductor and/or at interfaces between metal-containing material and polysilicon. In another instance, annealing is used in the formation of the salicide, for example, where metal is deposited on polysilicon and/or where a trench includes metal-polysilicon interfaces. With these approaches, the resistance of electrical connection made to the buried emitter region via the salicided conductor is less than the resistance that the electrical connection would be, were the salicide not present. These approaches are also useful, for example, in reducing the operating voltage of the thyristor-based device.

In another example embodiment of the present invention, the buried emitter region is formed in a doped well region of substrate that is susceptible to carrier accumulation from the buried emitter region. A second conductor is made to the doped well region for draining carriers accumulated therein. For more information regarding thyristor-based applications and for specific information regarding conductive contact applications that may be implemented in connection with one or more example embodiments of the present invention, reference may be made to the above-referenced U.S. patent applications entitled "Trench Isolation for Thyristor-based Device" (Horch et al.) and "Buried Emitter Contact for Thyristor-based Semiconductor Device" (Horch et al.).

FIG. 1A is a schematic of a thyristor-based semiconductor device having a conductor 155 extending to a buried emitter region 112 of a thyristor, according to another example embodiment of the present invention. The device 100 includes a thyristor body 110 and a pass device 130 (e.g., a transistor) electrically coupled in series and adapted for storing data at a storage node 118. The data is stored, for instance, as a function of the conductance state of the thyristor body 110. Control ports 120 and 138 are adapted to control current flow in the thyristor body 110 and in the pass device 130, respectively, in response to signals applied to first (WL1) and second (WL2) wordlines 107 and 108. A contact 155 electrically couples a signal from a reference voltage line 109 (Vref) to a buried emitter region 112 of the thyristor body 110. A bitline contact 160 electrically couples a signal from a bitline 162 to a source/drain region of the pass device 138. In response to signals applied to WL1 and WL2, and using signals at the bitline 162 and Vref line 109, the device 100 is adapted to write data to and/or read data from the storage node 118. For more information regarding data storage and manipulation with a thyristor-based device, such as the device 100, reference may be made to U.S. Pat. No. 6,229,161, which is fully incorporated herein by reference.

Figure 1B:
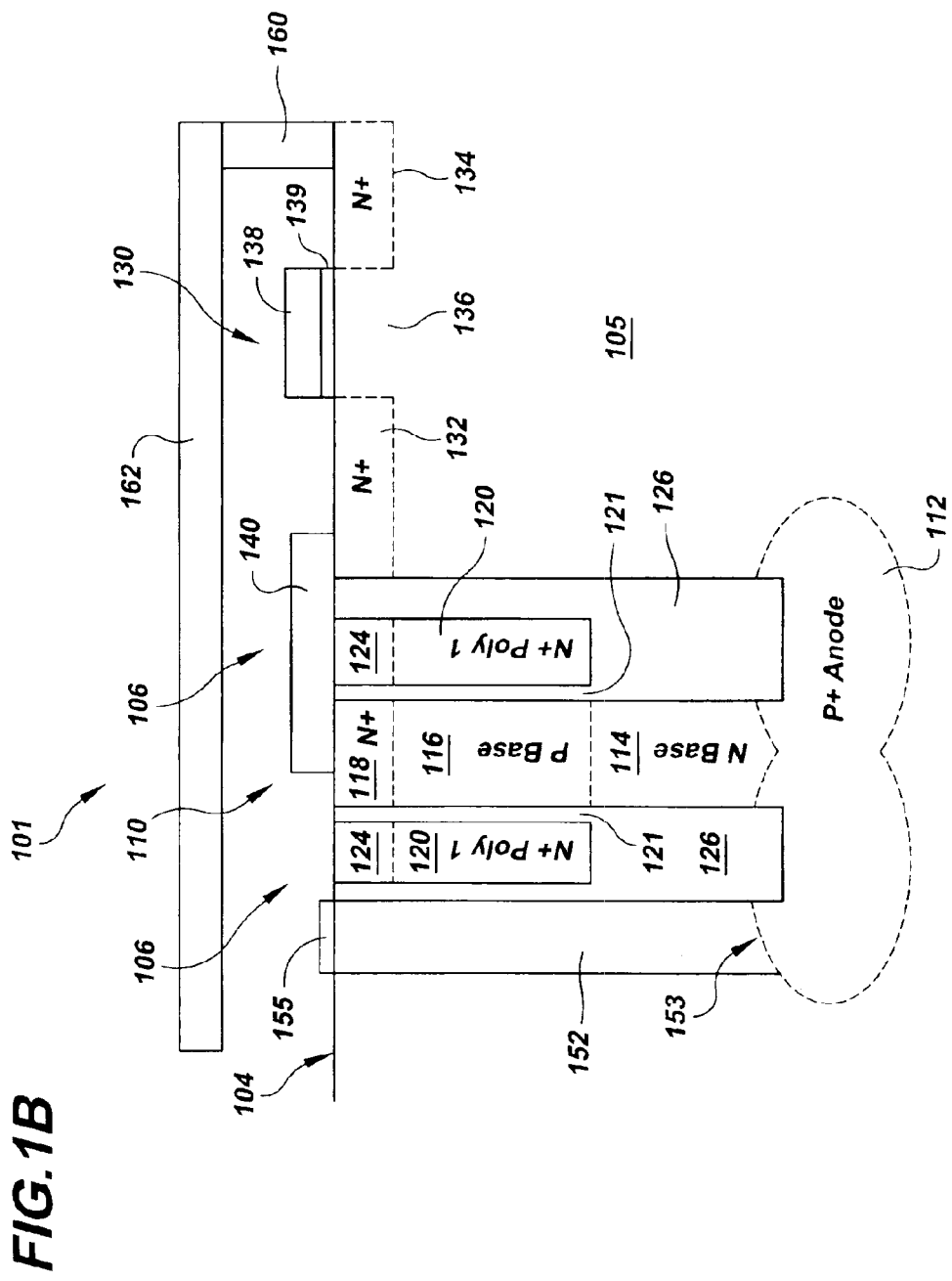
FIG. 1B is a thyristor-based semiconductor device having a contact to a buried emitter, according to another example embodiment of the present invention.

FIG. 1B is one implementation of the schematic shown in FIG. 1A with similar articles having similar numbering, according to a more particular example embodiment of the present invention. A thyristor-based semiconductor device 101 includes a conductor comprising a doped polysilicon pillar 152 with a salicided upper portion 155 for making electrical contact to a buried thyristor P+ anode emitter region 112 through a substrate 105 having an upper surface 104. Optionally, the salicided upper 155 is omitted, with electrical contact made directly via the doped polysilicon pillar 152. The device 101 further includes a thyristor body region 110 including the buried P+ anode emitter region 112, N base region 114, P base region 116 and N+ cathode emitter region 118. The buried emitter region 112 is implanted in a substrate 105 via a bottom portion of a trench 106 that is etched in the substrate and around the thyristor body region 110.

The trench 106 is lined with a dielectric material 121 and an insulator material 126 is formed in a bottom portion of the trench. Conductive material is formed in the lined trench and over the insulative material to form a control port 120 that is adapted for capacitively coupling to the thyristor body region 110 via the dielectric material 121 for controlling current flow in the thyristor body 110 region. Additional insulator material 124 fills the trench over the control port 120. For general information regarding thyristor applications and for specific information regarding approaches for filling a trench that can be used in connection with one or more example embodiments of the present invention, reference may be made to Lutzen et al., "Integration of Capacitor for Sub-100-nm DRAM Trench Technology," 2002 Symposium on VLSI Technology Digest of Technical Papers, which is fully incorporated herein by reference.

The semiconductor device 101 further includes a pass device 130 (e.g., transistor) having a dielectric material 139 and a gate electrode 138 formed over a channel region 136 in the substrate 105, and N+ source/drain regions 132 and 134 formed on opposite sides of the channel region 136. The gate electrode 138 is adapted to control current flow between the source/drain regions 132 and 134 in response to a voltage being applied thereto.

The pass device 130 and the thyristor body region 110 are coupled in series between the source/drain region 132 and the N+ emitter region 118 via a conductive interconnect 140. The pass device 130 is coupled to a bitline 162 via a contact 160 made to N+ source/drain region 134, and the buried P+ anode emitter region 112 is electrically coupled to a reference voltage via the doped polysilicon pillar 152 and salicided upper portion 155. The salicided upper portion 155 of the polysilicon pillar 152 reduces the resistance of the electrical contact made to the buried emitter region, relative to the resistance of an electrical contact made to the buried emitter region, were the upper portion not salicided. In response to signals applied to the gate 138 and to the control port 120, and using the reference voltage applied to the salicided pillar 152 and a signal at the bitline 162, data is written to and/or read from the N+ cathode emitter region 118.

In another implementation of the device shown in FIG. 1B, an interface 153 between the polysilicon pillar 152 and the buried emitter region 112 includes salicide and/or silicide. In one instance, the salicide and/or silicide interface 153 is formed by depositing a thin layer of titanium before doped polysilicon deposition for forming the pillar 152. The titanium and doped polysilicon are then used to form the salicide/silicide at the interface 153.

In still another implementation, the polysilicon pillar 152 in FIG. 1B is lined with a metal layer, such as a layer including tungsten, at the interface 153. The lined metal layer at the interface 153 reduces contact resistance to the buried emitter region 112. In one instance, some or all of the polysilicon pillar 152 is replaced with metal, with the salicided upper portion 155 being optionally omitted in the instance that all of the polysilicon pillar is replaced with metal.

Various ones of the example embodiments described below in connection with the figures share similar features with each other and with FIGS. 1A and 1B. In each of these example embodiments, certain discussion of similar features that are similarly numbered is omitted for brevity.

Figure 1C:
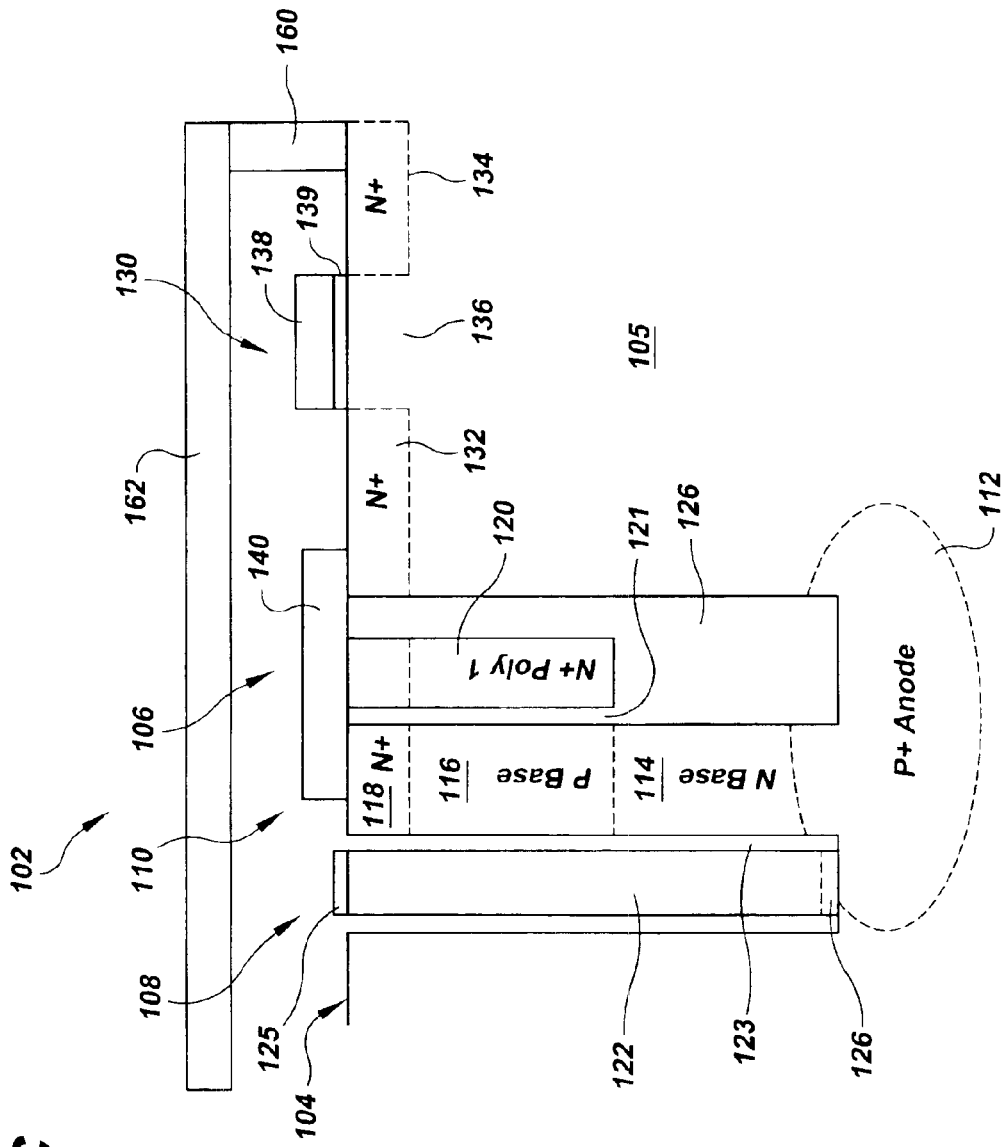
FIG. 1C is a thyristor-based semiconductor device having a conductive contact to a buried emitter, according to another example embodiment of the present invention.

FIG. 1C is another example embodiment of the present invention, similar to FIG. 1B but having a pillar 122 disposed in a trench 106 adjacent to a thyristor body 110 of a semiconductor device 102. In this implementation, the trench 106 extends at least partially around the thyristor body 110, is partially filled as discussed in connection with FIG. 1B above, and also is partially filled with a conductive pillar 122 having a salicide portion 125 near an upper surface of the substrate 105. In one implementation, a portion 126 of the conductive pillar, shown with dashed lines, near a bottom of the trench 106 includes a salicide, with the salicide portion 125 being optionally omitted. The trench includes an insulative material 123 that is adapted to electrically isolate the conductive pillar 122 from the thyristor body 110, while a bottom portion of the trench is immediately adjacent to the P+ anode emitter region 112, facilitating contact between the emitter region and the conductive pillar.

In one implementation, the control port 120 in FIG. 1C is formed in the trench and around the entire thyristor body, with a portion of the control port being subsequently etched from the trench. The conductive pillar is then formed in a portion of the trench where the control port has been etched. In this implementation, the insulative material 123 also insulates the conductive pillar 122 from the control port 120. The arrangement shown in FIG. 1C is also useful in highly dense applications, as the length of the device is reduced, relative to the length of the device shown in FIG. 1B.

Figure 2:
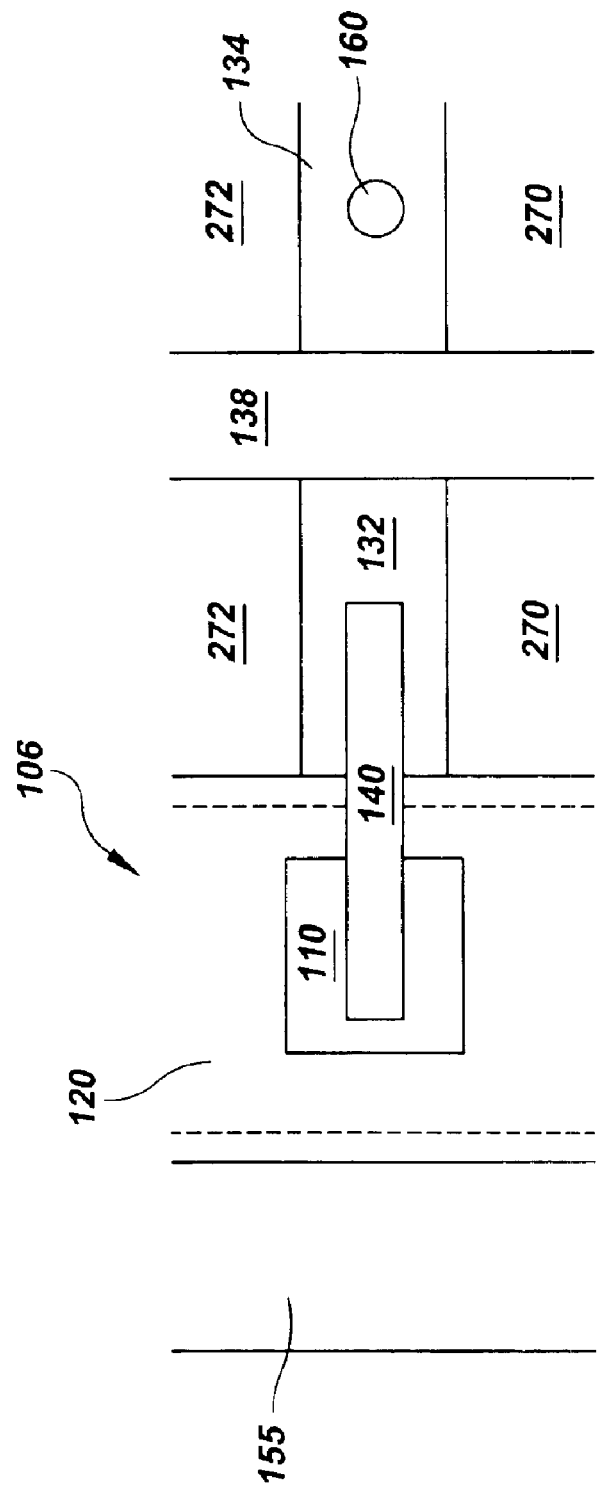
FIG. 2 is a top view of a thyristor-based semiconductor device having a conductive contact to a buried emitter, according to another example embodiment of the present invention.

FIG. 2 is a top view of a thyristor-based semiconductor device, similar to that shown in FIG. 1B, according to another example embodiment of the present invention. In this implementation, the gate 138 is part of a first word line (e.g., WL1 107 shown in FIG. 1A) and the control port 120 is part of a second word line (e.g., WL2 108 shown in FIG. 1A). Control port 120 is formed around the thyristor body region 110, which is electrically connected to the source/drain region 132 of the pass device via interconnect 140. Shallow trench isolation (STI) regions 270 and 272 electrically isolate the device from adjacent circuitry (not shown). The conductive pillar with upper salicide portion 155 extends laterally parallel to the first and second word lines.

Figure 3:
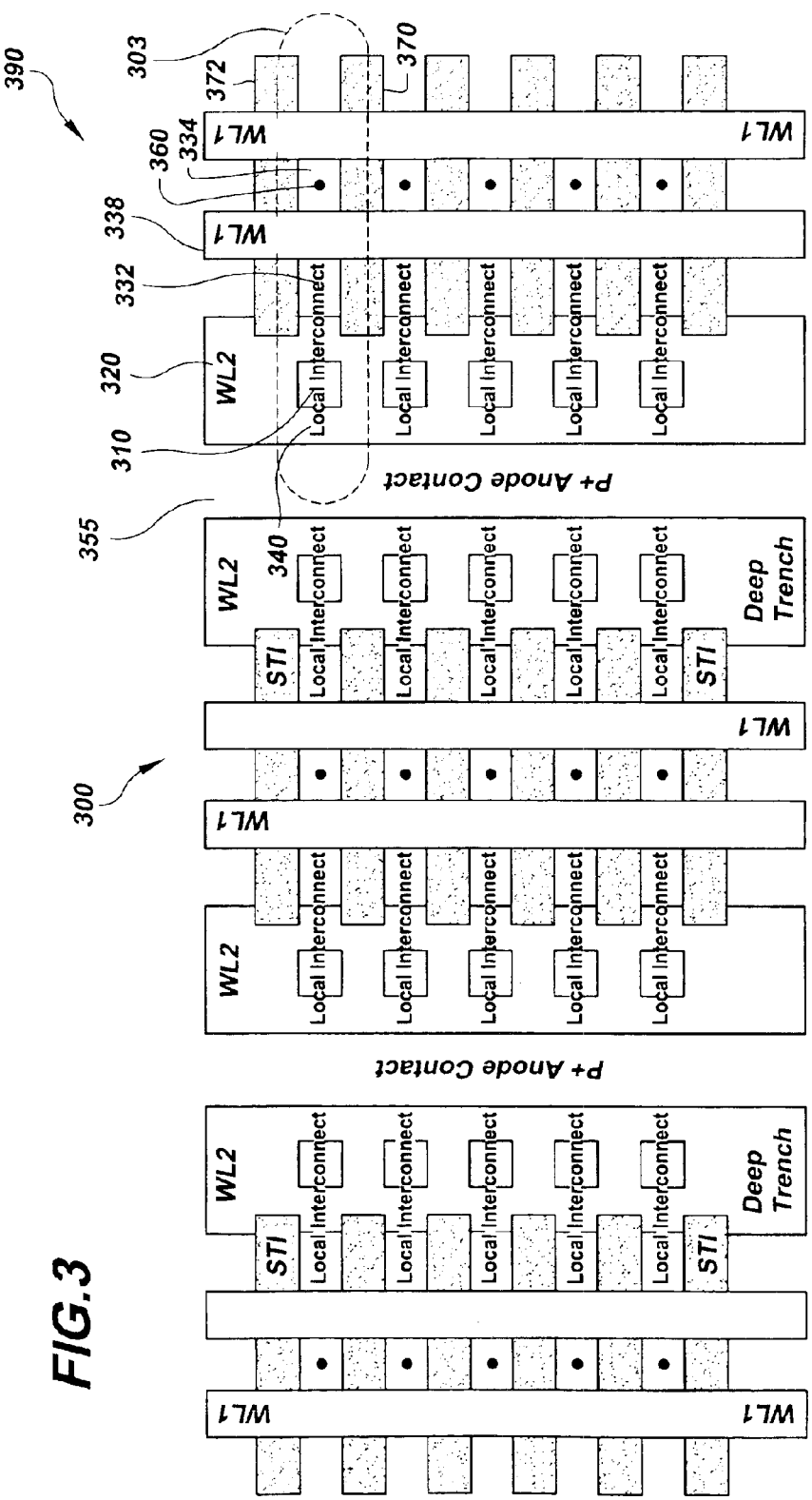
FIG. 3 is a memory array having a plurality of thyristor-based devices and a conductive emitter contact in parallel with a word line for the thyristor-based devices, according to another example embodiment of the present invention.

FIG. 3 is a memory array 300 including at least one thyristor-based memory cell having a conductive pillar contact to a buried emitter, according to another example embodiment of the present invention. The thyristor-based memory cell may, for example, include one or more of the devices shown in FIGS. 1A, 1B, 1C and 2. Each memory cell includes a pass device coupled in series with a thyristor having a buried emitter region (e.g., as shown in FIGS. 1B and 1C). A variety of memory cells share word lines, bitlines and conductive pillar contacts, as shown.

By way of example, memory cell 303 in the array is described as follows; one or more of the other memory cells in the array may be implemented with similar characteristics. Referring to memory cell 390, shallow trench isolation (STI) regions 370 and 372 electrically isolate adjacent memory cells. A control port (WL2) 320 surrounds a portion of a thyristor body region 310, with the control port and thyristor body region forming a thyristor and with the control port also extending to and being used by adjacent memory cells. A thyristor emitter region (e.g., such as region 112 in FIG. 1B) is below other portions of the thyristor body 310. A conductive pillar having an upper salicided portion 355 makes electrical connection to buried emitter regions of adjacent memory cells. A pass device including source/drain regions 332 and 334 separated by a channel region below a first word line (WL1) 338, is coupled in series with the thyristor body via a conductive interconnect 340 extending from the source/drain region 332. A bitline contact 360 electrically couples the source/drain region 334 to a metal1 (M1) bitline. The salicided upper portion 355 extends in a direction that is parallel to a direction that the emitter regions of adjacent memory cells extend, as well as parallel to a direction that the first and second word lines extend, electrically coupling the buried emitter regions of the adjacent memory cells.

In one implementation, buried emitter regions of two or more adjacent memory cells overlap, and electrical contact to the buried emitter regions is made using a single pillar extending to one of the buried emitter regions. Referring to the array 300, one or more of the conductive contacts may then be coupled using a salicided upper portion such as upper portion 355. With this approach, contact to the buried emitter regions of individual memory cells can be made via a contact to the salicided upper portion 355, for example, without necessarily making contact near the individual memory cells.

In another implementation, each of the memory cells in the array 300 includes a conductive contact extending to a buried emitter region of the thyristor in the cell. The salicided upper portion 355 is coupled adjacent conductive pillar contacts, such that contact to the buried emitter region of individual memory cells can be made via a contact to the salicided upper portion. With this approach, the resistance of contact made to the buried emitter regions is reduced, for example, relative to contact made to the buried emitter regions via other buried emitter regions, such as discussed above.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN body sections in the thyristor; and interchanging P and N regions and/or interchanging PMOSFETS with NMOSFETS. In addition, for general information regarding thyristors including thin capacitively-coupled thyristors, and for particular information regarding implementations to which the present invention is applicable and their respective operations and construction, reference may be made to U.S. Pat. No. 6,229,161, which is fully incorporated herein by reference. Such modifications and changes do not depart from the true spirit and scope of the present invention that is set forth in the following claims.

What is claimed is:

1. A thyristor-based semiconductor device comprising:
    a substrate having an upper surface;
    a thyristor having at least two vertically-arranged regions, said at least two vertically-arranged regions including an emitter region buried in the substrate and an upper base region above the emitter region and at least partially below the upper surface and having a control port configured and arranged to control current flow in the thyristor; and
    a conductor extending from the emitter region and upwardly to at least the upper surface, the conductor including a low resistance material.

2. The device of claim 1, further comprising a pass device having first and second source/drain regions separated by a channel region and a gate capacitively coupled to the channel region, the first source/drain region being electrically coupled in series to an emitter region of the thyristor.

3. The device of claim 1, wherein the conductor is in a trench having an electrically insulative liner material on sidewalls of the trench.

4. The device of claim 3, wherein a bottom portion of the trench is not lined with the electrically insulative material and wherein the conductor is contiguously adjacent to the unlined bottom portion of the trench and makes electrical contact to the emitter region via the unlined bottom portion.

5. The device of claim 4, wherein the conductor includes metal deposited at the unlined bottom portion of the trench and doped polysilicon filling the remaining portion of the trench over the metal, with the metal being disposed contiguously adjacent to and between both the doped polysilicon and the emitter region.

6. The device of claim 4, wherein the conductor further includes a salicide material at the unlined bottom portion of the trench and doped polysilicon filling the remaining portion of the trench over the salicide material, with the salicide material being disposed contiguously adjacent to and between both the doped polysilicon and the emitter region.

7. The device of claim 3, wherein the trench extends around a portion of the thyristor.

8. The device of claim 3, wherein the trench extends into the emitter region.

9. The device of claim 3, further comprising a metallic liner material on the insulative liner material and wherein the conductor includes doped polysilicon filled in the lined trench.

10. The device of claim 1, wherein the conductor includes doped polysilicon.

11. The device of claim 10, further comprising a salicide material on the doped polysilicon, a portion of the salicide material being at least as high as the upper surface.

12. The device of claim 1, wherein the conductor includes metal.

13. The device of claim 1, wherein the emitter region is buried in a well region of the substrate below the upper surface and wherein the conductor electrically couples to both the emitter region and a portion of the well region below the emitter region, thereby electrically shorting the emitter region to the well region.

14. The device of claim 1, wherein the thyristor comprises:
    a first base region in a portion of the substrate adjacent to a trench in the substrate and contiguously adjacent to the emitter region;

a second base region contiguously adjacent to the first base region;

a second emitter region contiguously adjacent to the second base region, the first and second base region being between the first and second emitter regions; and wherein the control port is in the trench and adapted to capacitively couple to at least one of the first and second base regions and to control current flow in the thyristor.

15. The device of claim 14, further comprising a dielectric material on a sidewall of the trench, wherein the control port is adapted to capacitively couple to at least one of the first and second base regions via the dielectric material.

16. The device of claim 15, wherein the trench extends around a portion of the substrate including the first base region and wherein the control port and the conductor are in different portions of the same trench and electrically isolated from each other.

17. The device of claim 1, wherein the low resistance material is adapted to reduce resistance for electrically coupling to the emitter region via the conductor, relative to the resistance that would be exhibited by a direct electrical coupling to the emitter region, without the low resistance material.

18. The device of claim 1, wherein the thyristor is a thin capacitively-coupled thyristor.

19. A thyristor-based memory cell comprising:

a substrate having an upper surface;

a thyristor having contiguous regions including first and second base regions disposed between first and second emitter regions, with the first base region being disposed between the first emitter region and the second base region and with the second base region being disposed between the first base region and the second emitter region, the first emitter region being buried in the substrate and below another of the contiguous regions that is at least partially below the upper surface, the second emitter region being configured and arranged to store data;

a conductor extending from the first emitter region, through the substrate and at least to the upper surface; and a pass device having first and second source/drain regions separated by a channel region and a gate capacitively coupled to the channel region, the first source/drain region being electrically coupled in series to the second emitter region, the gate being adapted to control current flow between the second source/drain region and the second emitter region, wherein the control port and the gate are adapted to effect read and write access to the second emitter region in response to voltages respectively applied thereto.

20. The memory cell of claim 19, wherein the gate is part of a first word line and wherein the control port is part of a second word line, the memory cell being configured and arranged for read and write access to the second emitter region in response to signals applied to the first and second word lines.

21. The memory cell of claim 20, wherein the conductor is electrically coupled to a power supply.

22. The memory cell of claim 20, wherein the conductor includes an upper portion that extends laterally parallel to the second word line.

23. A memory array comprising a plurality of thyristor-based memory cells, each memory cell comprising:

a thyristor adapted to store data and having an emitter region buried in a substrate having an upper surface; and a conductor electrically coupled to the buried emitter region and extending from the buried emitter region at least to the upper surface of the substrate, the conductor being electrically accessible without necessarily breaching the upper surface of the substrate.

24. The memory array of claim 23, further comprising a power supply electrically coupled to each of the conductors.

25. The memory array of claim 23, wherein the conductor includes a salicide material.

26. The device of claim 23, further comprising a word line adapted to capacitively couple to the thyristor for controlling current in the thyristor, wherein a portion of the conductor extends in a direction that is parallel to the word line.

27. The device of claim 23, wherein the thyristor has at least two contiguous regions of opposite polarity, a first contiguous region including the emitter region and a second contiguous region being disposed vertically above the first contiguous region with at least a portion thereof being disposed below the upper surface.

28. The device of claim 27, wherein the entire thyristor is disposed in the substrate and below the upper surface.

* * * * *